United States Patent
Kundu et al.

(10) Patent No.: US 6,750,674 B1
(45) Date of Patent: Jun. 15, 2004

(54) CARRY CHAIN FOR USE BETWEEN LOGIC MODULES IN A FIELD PROGRAMMABLE GATE ARRAY

(75) Inventors: Arunangshu Kundu, San Jose, CA (US); Jerome Fron, Palo Alto, CA (US)

(73) Assignee: Actel Corporation, Mountain View, CA (US)

(*) Notice: Subject to any disclaimer, the term of this patent is extended or adjusted under 35 U.S.C. 154(b) by 0 days.

(21) Appl. No.: 10/264,288

(22) Filed: Oct. 2, 2002

(51) Int. Cl.[7] .......................................... H03K 19/173
(52) U.S. Cl. ........................................ 326/38; 326/41
(58) Field of Search ....................... 326/38–41; 708/670

(56) References Cited

U.S. PATENT DOCUMENTS

| | | | |
|---|---|---|---|
| 4,255,748 A | 3/1981 | Bartlett ........................ 340/661 |
| 4,625,313 A | 11/1986 | Springer ........................ 371/20 |
| 4,638,187 A | 1/1987 | Boler et al. ................... 307/451 |
| 4,638,243 A | 1/1987 | Chan ............................ 324/51 |
| 4,684,830 A | 8/1987 | Tsui et al. ..................... 307/465 |
| 4,700,130 A | 10/1987 | Bloemen ....................... 324/110 |
| 4,706,216 A | 11/1987 | Carter .......................... 365/94 |
| 4,713,557 A | 12/1987 | Carter .......................... 307/242 |
| 4,717,912 A | 1/1988 | Harvey et al. .......... 340/825.83 |
| 4,718,042 A | 1/1988 | Moll et al. ................... 365/201 |
| 4,742,252 A | 5/1988 | Agrawal ....................... 307/465 |
| 4,772,812 A | 9/1988 | Desmarais .................... 307/473 |
| 4,800,176 A | 1/1989 | Kakumu et al. ............... 438/193 |
| 4,857,774 A | 8/1989 | El-Ayat et al. ................ 307/465 |
| 4,870,300 A | 9/1989 | Nakaya et al. ................ 307/303 |
| 4,870,302 A | 9/1989 | Freeman ....................... 307/465 |
| 4,873,459 A | 10/1989 | El Gamal et al. ............. 307/465 |
| 4,928,023 A | 5/1990 | Marshall ....................... 307/443 |
| 4,930,097 A | 5/1990 | Ledenbach et al. ........... 364/716 |
| 4,935,645 A | 6/1990 | Lee .............................. 307/362 |
| 4,959,561 A | 9/1990 | McDermott et al. .......... 307/443 |
| 4,978,905 A | 12/1990 | Hoff et al. .................... 323/314 |
| 5,008,855 A | 4/1991 | Eltoukhy et al. .............. 365/96 |
| 5,046,035 A | 9/1991 | Jigour et al. .................. 364/716 |
| 5,083,083 A | 1/1992 | El-Ayat et al. ............ 324/158 R |
| 5,121,394 A | 6/1992 | Russell ........................ 371/22.1 |
| 5,122,685 A | 6/1992 | Chan et al. ................. 307/465.1 |
| 5,126,282 A | 6/1992 | Chiang et al. ................ 437/172 |

(List continued on next page.)

FOREIGN PATENT DOCUMENTS

| | | | |
|---|---|---|---|
| EP | 0 415 542 A2 A3 | 3/1991 | ......... H03K/19/173 |
| EP | 0 889 593 A1 | 1/1999 | ......... H03K/19/173 |
| EP | 1 137 188 A2 | 9/2001 | ............. H03L/7/08 |

OTHER PUBLICATIONS

US 6,564,273, 5/2003, Plants (withdrawn)

L. Ashby, "ASIC Clock Distribution using a Phase Locked Loop (PLL)", *Proceedings Fourth Annual IEEE International ASIC Conference and Exhibit*, pp. 6.1–6.3, Sep. 1991.

(List continued on next page.)

*Primary Examiner*—Don Le
(74) *Attorney, Agent, or Firm*—Sierra Patent Group, Ltd.

(57) ABSTRACT

A field programmable gate array comprising a plurality of logic modules each logic module having two clusters, said logic modules arranged in rows and columns. The logic module clusters having a plurality of receiver components, a plurality of transmitter components, at least one buffer module, and at least one sequential logic components. Each logic module also comprises at least one left combinatorial logic unit having a carry-in input and carry-out output and at least one right combinatorial logic unit having a carry-in input and carry-out output adjacent to said left combinatorial logic unit. The carry-out output of the left combinatorial unit is hardwired to the carry-in input of said right combinatorial logic unit providing dedicated carry-in/carry-out logic circuitry.

8 Claims, 5 Drawing Sheets

OTHER PUBLICATIONS

| | | | |
|---|---|---|---|
| 5,132,571 A | 7/1992 | McCollum et al. | 307/465.1 |
| 5,144,166 A | 9/1992 | Camarota et al. | 307/465.1 |
| 5,187,392 A | 2/1993 | Allen | 307/465 |
| 5,198,705 A | 3/1993 | Galbraith et al. | 307/465 |
| 5,208,491 A | 5/1993 | Ebeling et al. | 307/465 |
| 5,220,213 A | 6/1993 | Chan et al. | 307/465 |
| 5,220,215 A | 6/1993 | Douglas et al. | 307/465 |
| 5,221,865 A | 6/1993 | Phillips et al. | 307/465 |
| 5,222,066 A | 6/1993 | Grula et al. | 371/21.1 |
| 5,258,319 A | 11/1993 | Inuishi et al. | 437/35 |
| 5,272,388 A | 12/1993 | Bakker | 307/202.1 |
| 5,286,922 A | 2/1994 | Curtiss | 174/112 |
| 5,293,133 A | 3/1994 | Birkner et al. | 324/713 |
| 5,300,830 A | 4/1994 | Hawes | 307/465 |
| 5,300,832 A | 4/1994 | Rogers | 307/475 |
| 5,317,698 A | 5/1994 | Chan | 395/325 |
| 5,365,485 A | 11/1994 | Ward et al. | 365/221 |
| 5,367,207 A | 11/1994 | Goetting et al. | 307/465 |
| 5,375,089 A | 12/1994 | Lo | 365/189.04 |
| 5,394,033 A | 2/1995 | Tsui et al. | 326/41 |
| 5,394,034 A | 2/1995 | Becker et al. | 326/39 |
| 5,396,128 A | 3/1995 | Dunning et al. | 326/68 |
| 5,397,939 A | 3/1995 | Gordon et al. | 326/38 |
| 5,399,920 A | 3/1995 | Van Tran | 326/83 |
| 5,400,262 A | 3/1995 | Mohsen | 364/489 |
| 5,430,335 A | 7/1995 | Tanoi | 327/170 |
| 5,430,687 A | 7/1995 | Hung et al. | 365/230.08 |
| 5,469,003 A | 11/1995 | Kean | 326/39 |
| 5,469,396 A | 11/1995 | Eltoukhy | 365/210 |
| 5,473,268 A | 12/1995 | Declercq et al. | 326/80 |
| 5,485,103 A | 1/1996 | Pedersen et al. | 326/41 |
| 5,486,775 A | 1/1996 | Veenstra | 126/38 |
| 5,526,312 A | 6/1996 | Eltoukhy | 365/201 |
| 5,537,057 A | 7/1996 | Leong et al. | 326/41 |
| 5,546,019 A | 8/1996 | Liao | 326/81 |
| 5,559,464 A | 9/1996 | Orii et al. | 327/333 |
| 5,572,476 A | 11/1996 | Eltoukhy | 365/210 |
| 5,666,322 A | 9/1997 | Conkle | 365/233 |
| 5,670,905 A | 9/1997 | Keeth et al. | 327/333 |
| 5,744,979 A | 4/1998 | Goetting | 326/39 |
| 5,744,980 A | 4/1998 | McGowan et al. | 326/40 |
| 5,801,547 A | 9/1998 | Kean | 326/40 |
| 5,809,281 A | 9/1998 | Steele et al. | 395/497.01 |
| 5,815,003 A | 9/1998 | Pedersen | 326/39 |
| 5,815,004 A | 9/1998 | Trimberger et al. | 326/41 |
| 5,821,776 A | 10/1998 | McGowan | 326/41 |
| 5,825,200 A | 10/1998 | Kolze | 326/38 |
| 5,825,201 A | 10/1998 | Kolze | 326/39 |
| 5,825,202 A | 10/1998 | Tavana et al. | 326/39 |
| 5,825,662 A | 10/1998 | Trimberger | 364/491 |
| 5,828,230 A | 10/1998 | Young | 326/41 |
| 5,828,538 A | 10/1998 | Apland et al. | 361/56 |
| 5,831,448 A | 11/1998 | Kean | 326/41 |
| 5,832,892 A | 11/1998 | Yaoita | 123/260 |
| 5,835,165 A | 11/1998 | Keate et al. | 348/845.1 |
| 5,835,998 A | 11/1998 | Pedersen | 326/40 |
| 5,838,167 A | 11/1998 | Erickson et al. | 326/38 |
| 5,838,584 A | 11/1998 | Kazarian | 364/491 |
| 5,838,954 A | 11/1998 | Trimberger | 395/500 |
| 5,847,441 A | 12/1998 | Cutter et al. | 257/530 |
| 5,847,577 A | 12/1998 | Trimberger | 326/38 |
| 5,848,005 A | 12/1998 | Cliff et al. | 365/230.03 |
| 5,848,006 A | 12/1998 | Nagata | 365/230.06 |
| 5,850,151 A | 12/1998 | Cliff et al. | 326/39 |
| 5,850,152 A | 12/1998 | Cliff et al. | 326/40 |
| 5,850,564 A | 12/1998 | Ting et al. | 395/800.37 |
| 5,852,608 A | 12/1998 | Csoppenszky et al. | 370/465 |
| 5,854,763 A | 12/1998 | Gillingham et al. | 365/189.04 |
| 5,859,542 A | 1/1999 | Pedersen | 326/39 |
| 5,859,543 A | 1/1999 | Kolze | 326/41 |
| 5,859,544 A | 1/1999 | Norman | 326/40 |
| 5,861,761 A | 1/1999 | Kean | 326/41 |
| 5,869,981 A | 2/1999 | Agrawal et al. | 326/39 |
| 5,870,586 A | 2/1999 | Baxter | 395/500 |
| 5,880,492 A | 3/1999 | Duong et al. | 257/209 |
| 5,880,512 A | 3/1999 | Gordon et al. | 257/530 |
| 5,880,597 A | 3/1999 | Lee | 326/41 |
| 5,880,598 A | 3/1999 | Duong | 326/41 |
| 5,883,526 A | 3/1999 | Reddy et al. | 326/41 |
| 5,883,850 A | 3/1999 | Lee et al. | 365/230.03 |
| 5,949,719 A | 9/1999 | Clinton et al. | 365/189.01 |
| 5,952,847 A | 9/1999 | Plants et al. | 326/80 |
| 5,994,934 A | 11/1999 | Yoshimura et al. | 327/158 |
| 6,011,744 A | 1/2000 | Sample et al. | 365/230.03 |
| 6,034,677 A | 3/2000 | Noguchi et al. | 345/327 |
| 6,038,627 A | 3/2000 | Plants | 710/126 |
| 6,049,487 A | 4/2000 | Plants et al. | 365/189.04 |
| 6,111,448 A | 8/2000 | Shibayama | 327/293 |
| 6,181,174 B1 | 1/2001 | Fujieda et al. | 327/158 |
| 6,289,068 B1 | 9/2001 | Hassoun et al. | 375/376 |
| 6,292,016 B1 | 9/2001 | Jefferson et al. | 326/39 |
| 6,329,839 B1 | 12/2001 | Pani et al. | 326/41 |
| 6,430,088 B1 | 8/2002 | Plants et al. | 365/189.04 |
| 6,437,650 B1 | 8/2002 | Sung et al. | 331/25 |
| 6,476,636 B1 | 11/2002 | Lien et al. | 326/41 |
| 6,496,887 B1 | 12/2002 | Plants | 710/100 |

OTHER PUBLICATIONS

"AV9170 Clock Synchronizer and Multiplier", pp. 1–4, Nov. 8, 1992.

"AV9170 Application Note", AvaSem, pp. 1–7, Jan. 1993.

U. Ko, "A 30–ps Jitter, 3.6–$\mu$s Locking, 3.3–Volt digital PLL for CMOS Gate Arrays", *IEEE 1993 Custom Integrated Circuits Conference*, pp. 23.3.1–23.3.4, Conf. Date: May 9–12, 1993.

A Efendovich et al., "Multi–Frequency Zero–Jitter Delay–Locked Loop", *IEEE 1993 Custom Integrated Circuits Conference*, pp. 27.1.1–27.1.4, Conf. Date: May 9–12, 1993.

R. Quinnell, "Blending gate arrays with dedicated circuits sweetens ASIC development", EDN, pp. 29–32, Mar. 31, 1994.

J. Chen, "PLL–based clock systems span the system spectrum from green PCs to Alpha", EDN, pp. 147–148, 150, 152, 154–155, Nov. 9, 1995.

P. Sevalia, "Straightforward techniques cut jitter in PLL–based clock drivers", EDN, pp. 119–123, 125, Nov. 23, 1995.

D. Bursky, "Memories Hit New Highs And Clocks Run Jitter–Free", Electronic Design, pp. 79–80, 84–85, 89–93, Feb. 19, 1996.

ated gate array (FPGA) devices. More specifically, the system relates to a carry chain between combinatorial logic components within logic modules in an FPGA that will increase the performance in the FPGA.

CARRY CHAIN FOR USE BETWEEN LOGIC MODULES IN A FIELD PROGRAMMABLE GATE ARRAY

BACKGROUND OF THE SYSTEM

1. Field of the System

The present system relates to field programmable gate array (FPGA) devices. More specifically, the system relates to a carry chain between combinatorial logic components within logic modules in an FPGA that will increase the performance in the FPGA.

2. Background

FPGAs are known in the art. An FPGA comprises any number of logic modules, an interconnect routing architecture and programmable elements that may be programmed to selectively interconnect the logic modules to one another and to define the functions of the logic modules. An FPGA is an array of uncommitted gates with uncommitted wiring channels. To implement a particular circuit function, the circuit is mapped into an array and the wiring channels' appropriate connections are programmed to implement the necessary wiring connections that form the user circuit.

A gate array circuit can be programmed to implement virtually any set of functions. Input signals are processed by the programmed circuit to produce the desired set of outputs. Such inputs flow from a user's system, through input buffers and through the circuit, and finally back out the user's system via output buffers. Such buffers may provide any or all of the following input/output (I/O) functions: voltage gain, current gain, level translation, delay, signal isolation or hysteresis.

An FPGA core tile may be employed as a stand alone FPGA, repeated in a rectangular array of core tiles, or included with other devices in a system-on-a-chip (SOC). The core FPGA tile may include an array of logic modules, and input/output modules. An FPGA core tile may also include other components such as read only memory (ROM) modules. Horizontal and vertical routing channels provide interconnections between the various components within an FPGA core tile. Programmable connections are provided by programmable elements between the routing resources.

The programmable elements in an FPGA can be either one-time programmable or re-programmable. Re-programmable elements used in FPGA technologies may comprise transistors or other re-programmable elements as is well known to those of ordinary skill in the art. One-time programmable elements used in FPGA technologies may comprise antifuse devices.

In an integrated circuit, addition forms the basis for many logic operations from counting to multiplication. Adder logic is one of the preferred arithmetic logic functions in a digital FPGA system. An adder circuit is constructed using a group of logic gates. Adder circuits are used to implement the arithmetic operations (addition and/or subtraction) using two-input operands. Since addition/subtraction is a bit-by-bit operation, a full adder circuit should consist of two pieces of logic: "sum logic" to produce a sum result (S) on each corresponding operand bit and "carry logic" to generate a carry output (COUT) propagated between each successive operand bit.

FIG. 1 is a simplified schematic diagram illustrating a one-bit full adder. One-bit full adder 100 has an X input 114, a Y input 116 and an initial carry-in (CIN) 118. X input 114 and Y input 116 are coupled to an S output 120 through NOR gate 102. CIN 118 is coupled to an S output through NOR gate 104. Furthermore, X input 114, Y input 116 and CIN 118 are coupled to output COUT 122 through AND gates 106, 108, and 110 and OR gate 112.

The equation of the sum output S and carry-out output COUT 122 may be expressed mathematically as a function of the two-input operand x, y and the initial carry input CIN as follows:

$$S = x \oplus y \oplus CIN$$

$$COUT = x \cdot y + x \cdot CIN + y \cdot CIN$$

Two operands, each with n binary digits, can be added/subtracted using an n-bit ripple carry adder. An n-bit ripple carry adder is constructed by cascading n one-bit full adders.

FIG. 2 is a simplified schematic illustrating an n-bit ripple carry adder. N-bit ripple carry adder 200 is comprised of n one-bit full adders illustrated, for an example only, as 202, 204 and 206. Each one-bit full adder 202, 204 and 206 has X inputs 210, 214 and 228 and Y inputs 212, 214 and 226. Each one-bit adder also has a carry-in, CIN, input 208, 220 and 224 and a carry-out output, COUT, 218, 222 and 230. The inputs are n-bit X and Y values. The initial carry-in input to the least significant adder stage is normally set to 0 and the carry-out output of each adder stage is connected to the carry-in input of the next most significant adder. The n-bit S forms the sum result and the carry-out output of the most significant stage adder indicates the final carry-out of the arithmetic operation.

In the case of ripple adder, each adder has to wait for the carry-out output signal from the previous least significant adder before it can perform the calculation on the current stage. Thus, the most significant bit of the sum S and the final carry-out output COUT must be delayed until the sequential evaluation of the carry-out output from the least significant adder stage to the most significant adder stage. The total delay, Tn, associated with the ripple carry adder can be expressed in a formula as follows:

$$Tn = n \cdot Tc$$

where n=the number of full adder stages (number of binary digits in the operands) and Tc=the carry delay of one stage.

Based on the above equation, the delay of a ripple carry adder grows linearly with the number of binary digits in the operand. The sequential chain reaction makes the ripple adder very slow. A method of increasing the speed of the process is by calculating the carry-out outputs of each stage in parallel. This type of implementation is termed a carry lookahead adder.

FIG. 3 is a simplified schematic diagram illustrating an n-bit carry lookahead adder. N-bit carry lookahead adder 300 is comprised of n one-bit full adders illustrated as an example only as 302, 304 and 306. Each one-bit full adder 302, 304 and 306 has X inputs 308, 314 and 318 and Y inputs 310, 316 and 320. However, as opposed to the n-bit ripple carry adder, each one-bit adder shares a carry-in, CIN, input 212 while each n-bit full adder 302, 304 and 306 has a carry-out output, COUT, 324, 328 and 332. The inputs are n-bit X and Y values.

The carry-out output of the ith adder stage (the ith adder stage, which is used to calculate the S and COUT of the two operands' ith operand bit), Ci, can be expressed as follows:

$$Ci = Gi + Pi \cdot Cin$$

where $Gi = Xi \cdot Yi$ and $Pi = Xi + Yi$

Recursively expanding the above formula indicates that the carry logic of the ith stage Ci depends only on the operand input of the current stage adder (Xi, Yi) and all the previous least significant stage adders (Xi−1, Yi−1, ..., X0, Y0). Instead of waiting for the previous carry-out signal from the previous sequential stages, each stage's carry-out output signal may be anticipated from the determined operand inputs. These anticipated carry-out output signals are fast because they proceed through fewer logic stages in sequence. However, compared with the ripple adder, the carry lookahead adder requires an increased number of gates and increased layout area to implement the carry anticipation.

In addition to the issues set forth above, the majority of existing logic modules perform both combinatorial and sequential logic functions. The majority of logic modules that perform combinatorial logic functions can be programmed to implement a variety of functions including adder logic. In fact, a very high percentage of combinatorial logic units are used to perform adder logic. As user designs become more complicated and overall device size (more logic modules per FPGA) increases this number increases. In current devices, combinatorial logic modules can be programmed to implement either one-bit sum logic or the one-bit carry logic but not full adder logic (sum logic and carry logic can not be programmed into one single logic module). This implies that whenever an n-bit ripple adder is configured in the logic, 2n of the logic modules are used to implement the n-bit ripple adder, i.e., n combinatorial modules for the sum logic and n additional combinatorial modules for carry generation. When a lookahead adder is implemented, even more combinatorial modules are used.

Once carry logic is programmed into the user circuit, the carry logic uses many dedicated combinatorial modules which are consequently unavailable to perform other logic functions. This not only lowers the utilization efficiency, it also affects the performance of the device. This is because when the number of operand digits is larger more combinatorial modules are used to implement the carry logic and the overall carry generation speed is limited by the accumulated delays of combinatorial modules.

Thus, there is a need in the art for an n-bit adder that can perform sequential adder functions quickly. There is also a need in the art for an n-bit adder that can perform quickly without the need for numerous additional gates and additional layout area on the chip. There is also a need for dedicated carry logic to increase speed and performance of existing FPGAs.

SUMMARY OF THE SYSTEM

The presently disclosed system is an apparatus comprising a dedicated circuit to perform carry-in/carry-out functions.

The presently disclosed system comprises a field programmable gate array having a plurality of logic modules each logic module having two clusters, said logic modules arranged in rows and columns. The logic module clusters each have a plurality of receiver components, a plurality of transmitter components, at least one buffer module, and at least one sequential logic components. Each logic module also comprises at least one left combinatorial logic unit having a carry-in input and carry-out output and at least one right combinatorial logic unit having a carry-in input and carry-out output adjacent to said left combinatorial logic unit. The carry-out output of the left combinatorial unit is hardwired to the carry-in input of said right combinatorial logic unit providing dedicated carry-in/carry-out logic circuitry.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE DRAWINGS

Those of ordinary skill in the art will realize that the following description of the present invention is illustrative only and not in any way limiting. Other embodiments of the invention will readily suggest themselves to such skilled persons.

This disclosure may relate to data communications. Various disclosed aspects may be embodied in various computer and machine-readable data structures. Furthermore, it is contemplated that data structures embodying the teachings of the disclosure may be transmitted across computer and machine-readable media, and through communications systems by use of standard protocols such as those used to enable the Internet and other computer networking standards.

The disclosure may relate to machine-readable media on which are stored various aspects of the disclosure. It is contemplated that any media suitable for retrieving instructions is within the scope of the present disclosure. By way of example, such media may take the form of magnetic, optical, or semiconductor media, and may be configured to be accessible by a machine as is known in the art.

Various aspects of the disclosure may be described through the use of flowcharts. Often, a single instance of an aspect of the present disclosure may be shown. As is appreciated by those of ordinary skill in the art, however, the protocols, processes, and procedures described herein may be repeated continuously or as often as necessary to satisfy the needs described herein. Accordingly, the representation of various aspects of the present disclosure through the use of flowcharts should not be used to limit the scope of the present disclosure.

Figure 1:
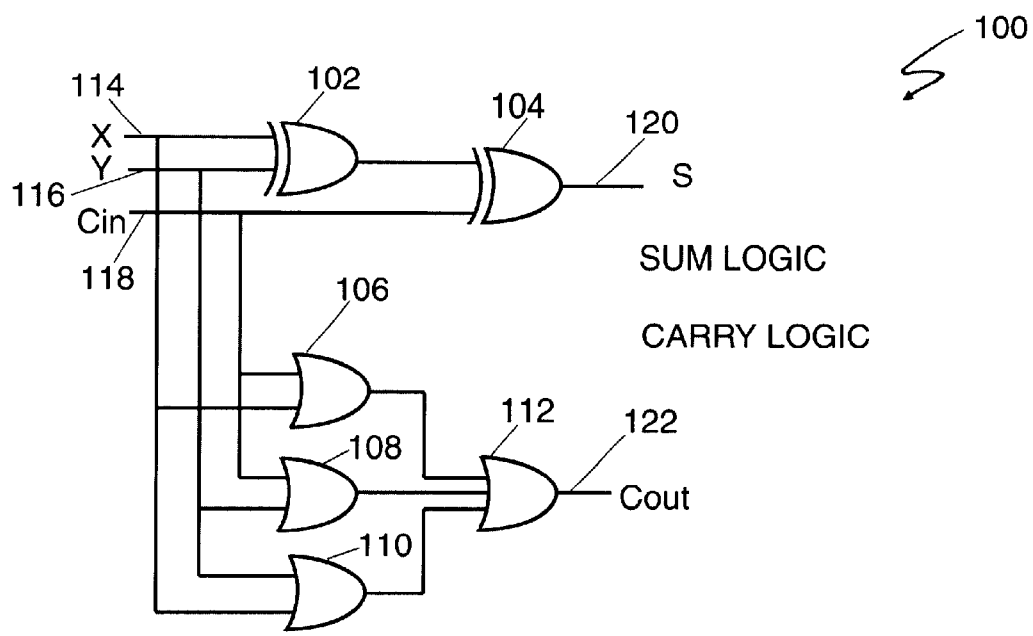
FIG. 1 is a simplified schematic diagram illustrating a 1-bit full adder.
Figure 2:
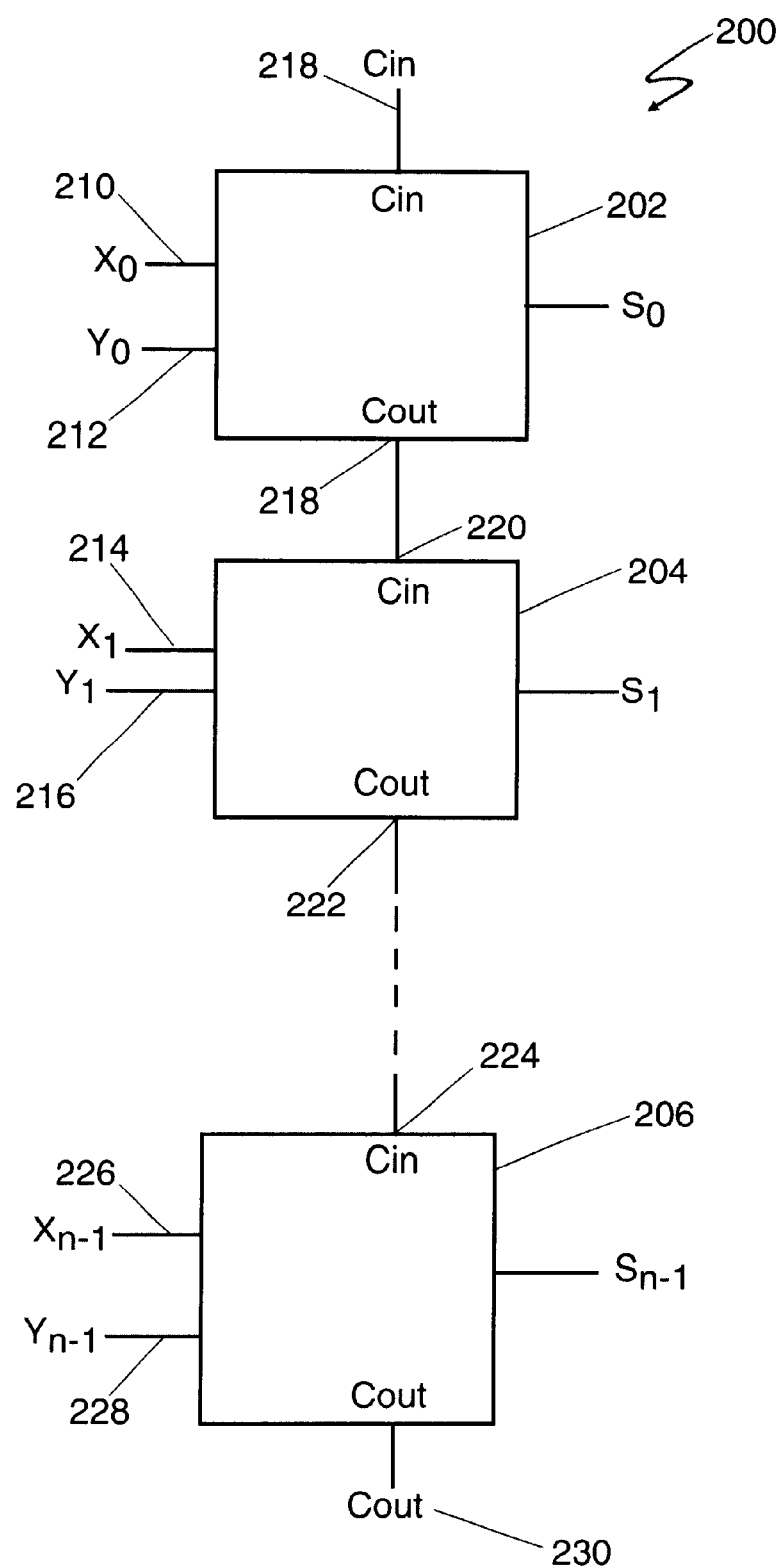
FIG. 2 is a simplified schematic illustrating an n-bit ripple carry adder.
Figure 3:
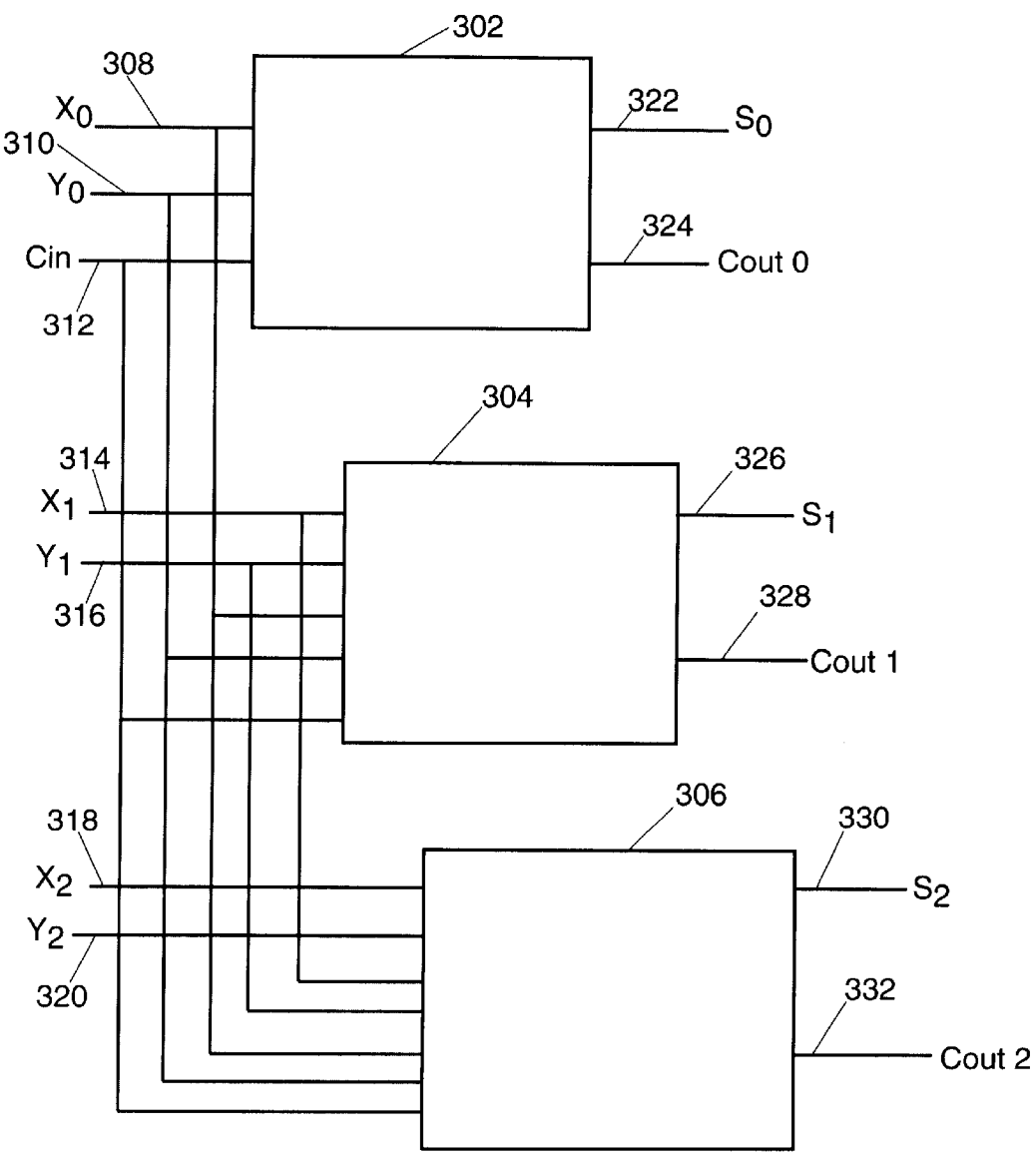
FIG. 3 is a simplified schematic diagram illustrating an n-bit carry lookahead adder.
Figure 4:
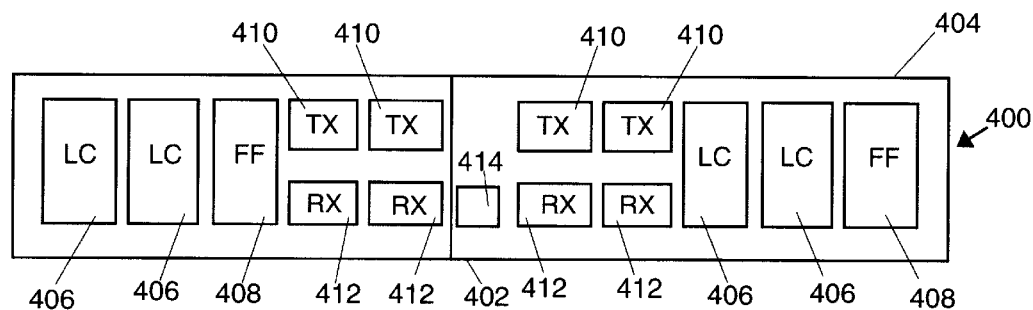
FIG. 4 is a simplified block diagram of a logic module of the present system.

FIG. 4 is a simplified block diagram of a logic module of the present system. Logic module 400 comprises two clusters 402 and 404. Clusters 402 and 404 each contain two logic components 406, a flip-flop 408, two receiver (RX) modules 412 and two transmitter (TX) modules 410. Logic module 400 also comprises a buffer module 414.

To avoid overcomplicating the disclosure and thereby obscuring the present invention, flip-flop modules 408, RX modules 412, TX modules 410 and buffer module 414 are not described in detail herein. The implementation of RX modules 412 and TX modules 410 suitable for use according to the present system is disclosed in U.S. patent application Ser. No. 10/323,613, filed on Dec. 18, 2002, and hereby incorporated herein by reference. The implementation of buffer module 414 suitable for use according to the present system is disclosed in U.S. patent application Ser. No. 10/293,895, filed Nov. 12, 2002, and hereby incorporated herein by reference.

Figure 5:
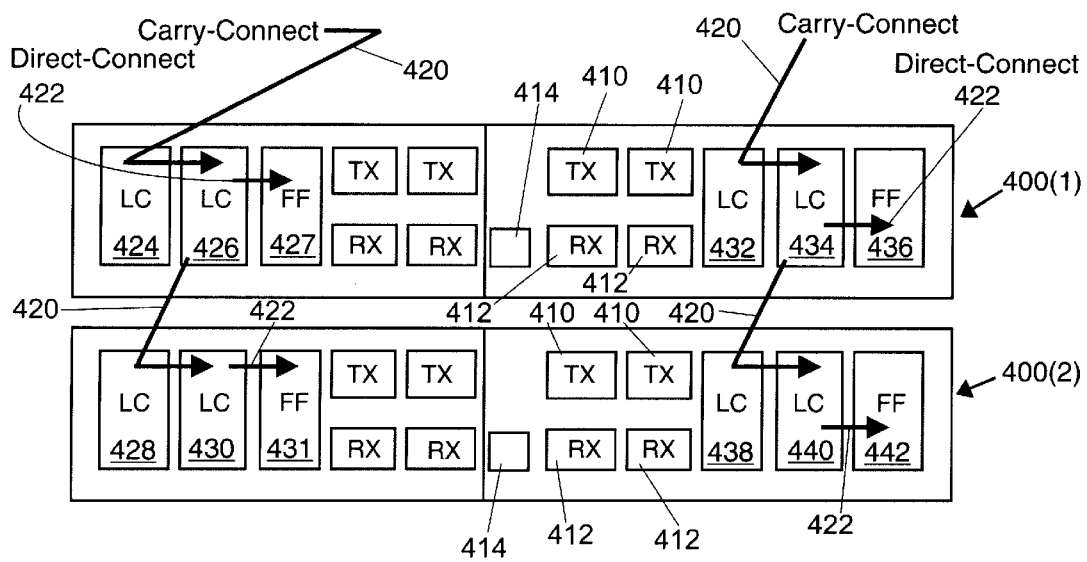
FIG. 5 is a simplified block diagram of a plurality of logic modules of the present system showing the carry chain connection of the presently disclosed system between logic modules.

FIG. 5 is a simplified block diagram of a plurality of logic modules of the present system showing the carry chain connection of the presently disclosed system between logic modules. As illustrated in FIGS. 4 and 5, each logic module 400 may contain two logic components 406 and a flip-flop 408. In the logic modules of the present system, logic components 406 perform combinatorial logic functions and flip-flop 408 performs sequential logic functions. As will be discussed in detail below, logic components 406 have circuits dedicated to carry logic, i.e., adder logic.

Referring still to FIG. 5, carry-connect, illustrated by carry-connect 420, comprises dedicated carry logic. Inside logic modules 400(1) and 400(2), the logic components on the left side 424, 432, 428, 438 of each cluster within logic module 400 have their carry outputs 420 coupled to the carry inputs of logic components 426, 430, 434, 440 directly to the right of logic components 424, 432, 428, 438. Logic components 426, 434, have their carry-out outputs directly coupled to logic clusters 434 and 430 on the left side of each cluster in logic module 400(2) in the row directly south of logic module 400(1). Thus, all the logic components carrying logic located in the same cluster column are linked together into a carry chain running from North to South. This configuration corresponds to the n-bit ripple carry adder from the least significant adder stage to the most significant adder stage.

From a performance point of view, the carry logic in the two logic components located in the same cluster of a logic module are grouped together to implement the 2-bit lookahead carry logic such that the carry-out output for the two bits is generated with minimal proposition delay from the carry input. As illustrated in FIG. 5, in this embodiment the connection of all groups of carry lookahead logic from North to South remains in a ripple carry structure.

Figure 6:
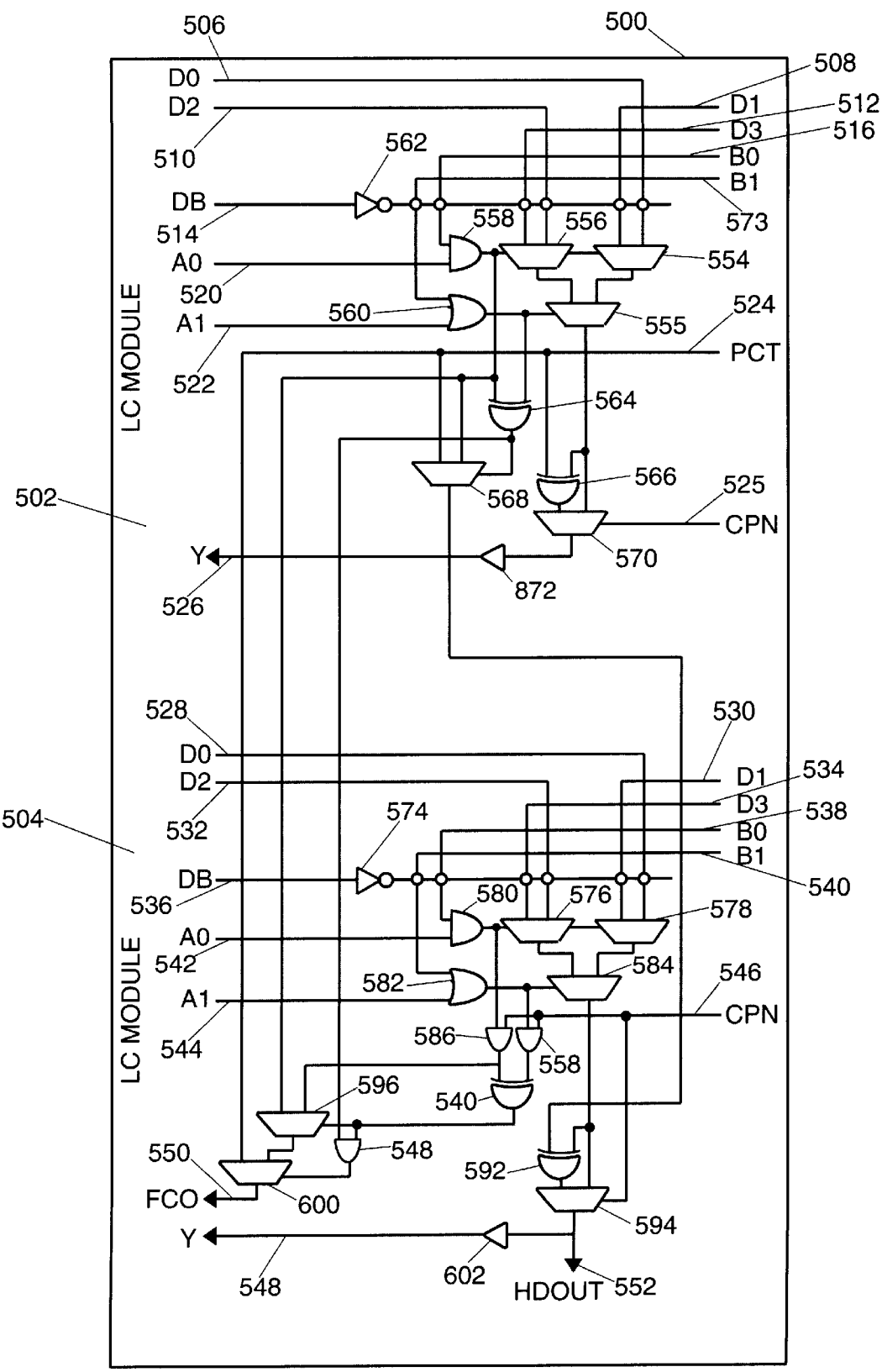
FIG. 6 is a simplified schematic diagram illustrating the dedicated carry-connect logic of the present system.

FIG. 6 is a simplified schematic diagram illustrating the dedicated carry-connect logic of the present system. FIG. 6 shows a simplified schematic of a carry lookahead group 500 of the present system. Carry lookahead group 500 comprises a left logic component 502 and a right logic component 504. Left logic component 502 comprises five D inputs 506, 508, 510, 512, 514, two B inputs 516, 518 and two A inputs 520, 522. According to the present invention, the logic component is configured to an adder and thus in this embodiment, one A input and one B input are used as the A and Y inputs, while the other A input, B input and five D inputs tied to either "1" or "0" correspondingly, so that the logic circuit behaves as an "adder" to the user.

Input 506 is coupled to Y output through two-input multiplexer 554, two input multiplexer 555, two-input multiplexer 570 and buffer 572. Input 506 may be selectively coupled to Y output through NOR gate 566. Input 508 may be coupled to Y output through two-input multiplexer 554, two input multiplexer 555, two-input multiplexer 570 and buffer 572. Input 508 may be selectively coupled to Y output through NOR gate 566. Input 510 may be coupled to Y output through two-input multiplexer 556, two input multiplexer 555, two-input multiplexer 570 and buffer 572. Input 510 may be selectively coupled to Y output through NOR gate 566. Input 512 may be coupled to Y output through the second input of two-input multiplexer 556, two input multiplexer 555, two-input multiplexer 570 and buffer 572. Input 512 may be selectively coupled to Y output through NOR gate 566. Input 514 may be coupled to Y output through inverter 562, two-input multiplexer 556, two input multiplexer 555, two-input multiplexer 570 and buffer 572. Input 514 may be selectively coupled to Y output through NOR gate 566. Input 514 may also be selectively coupled to two-input multiplexer 568 through AND gate 558 and NOR gate 564 providing the control signal to two-input multiplexer 568. Input 514 may also be selectively coupled to a first input of two-input multiplexer 568 through AND gate 558. Input 514 may also be selectively coupled to two-input multiplexer 568 through OR gate 560 and NOR gate 564 providing the control signal to two-input multiplexer 568. Finally, input 514 may also be selectively coupled to carry-out output 550 through inverter 562, AND gate 558 and two-input multiplexers 596 and 600.

Input 516 is coupled to AND gate 558, the output of which provides the control signal to two-input multiplexer 555. Input 518 is coupled to OR gate 560, the output of which provides the control signal to two-input multiplexer 555. Input 520 is coupled to AND gate 558, the output of which provides the control signal to two-input multiplexer 555. Input 522 is coupled to OR gate 560, the output of which provides the control signal to two-input multiplexer 555.

Carry-in input 525 in logic component 502 is coupled to carry-out output 550 in logic component 504 through a second input of two-input multiplexer 600. Carry-in input 525 in logic component 502 is coupled to Y output 526 in logic component 502 through NOR gate 566 and a second input of two-input multiplexer 570 and buffer 572. Carry-in input 525 in logic component 502 is coupled to Y output 548 in logic component 504 through a second input of two-input multiplexer 568, NOR gate 592, two-input multiplexer 594 and buffer 602.

Input 528 in logic component 504 may be coupled to Y output 548 and HDOUT output 552 in logic component 504 through two-input multiplexers 578, 584, 594 and buffer 602. Input 530 in logic component 504 may be coupled to Y output 548 and HDOUT output 552 in logic component 504 through two-input multiplexers 578, 584, 594 and buffer 602. Input 532 in logic component 504 is coupled to Y output 548 and HDOUT output 552 in logic component 504 through two-input multiplexers 576, 584, 594 and buffer 602. Input 534 in logic component 504 is coupled to Y output 548 and HDOUT output 552 in logic component 504 through two-input multiplexers 576, 584, 594 and buffer 602. Each of inputs 528, 530, 532, 534 may be selectively coupled to multiplexer 594 through NOR gate 592. Input 536 may be selectively coupled to Y output 548 and HDOUT output 552 in logic component 504 through inverter 574, two-input multiplexers 576, 584, 594 and buffer 602. Input 536 may also be selectively coupled to Y output 548 and HDOUT output 552 in logic component 504 through inverter 574, two-input multiplexers 578, 584, 594 and buffer 602. Input 536 may also be selectively coupled to carry-out output 550 through inverter 574, OR gate 582, AND gate 588, NOR gate 590, AND gate 598 and multiplexer 600. Input 536 may also be selectively coupled to carry-out output 550 through inverter 574, AND gate 580, AND gate 586, NOR gate 590, AND gate 598 and multiplexer 600.

HDOUT output 552 may be the inverted signal of Y output 548. Output 552 is coupled to the input of the flip-flop located in the same logic cluster. This enables the "fast connection" between the logic component and the flip-flop within the same logic cluster.

Input 538 may also be selectively coupled to carry-out output 550 through AND gate 580, AND gate 586, NOR gate 590, AND gate 598 and multiplexer 600. The output of AND gate 586 also provides an input to two-input multiplexer 596. Input 540 may be selectively coupled to carry-out output 550 through OR gate 582, AND gate 588, NOR gate 590, AND gate 598 and multiplexer 600.

Input 542 may be coupled to carry-out output 550 through AND gate 580, AND gate 586, NOR gate 590, AND gate 598 and multiplexer 600. The output of AND gate 586 also provides an input to two-input multiplexer 596. Input 544 may be selectively coupled to carry-out output 550 through OR gate 582, AND gate 588, NOR gate 590, AND gate 598 and multiplexer 600.

The carry logic for each logic component may be individually disabled by a program signal "CFN" that specifically controls that logic component. Specifically, each bit of the carry logic inside of the two-bit carry lookahead adder may be independently controlled. The ability to control each bit of the carry logic allows for the place and route software to insert any bits of adders in the middle of a cluster column while leaving the logic components located before and after the adder available for other combinatory functions other than adder logic.

It should be understood that various alternatives to the embodiments of the disclosed method and apparatus described herein maybe employed in practicing the disclosed method and using the disclosed apparatus. It is intended that the following claims define the scope of the disclosed method and apparatus and that methods and structures within the scope of these claims and their equivalents be covered thereby.

What is claimed is:

1. An apparatus for forming a carry chain in a field programmable gate array comprising:
   a plurality of logic modules arranged in rows and columns, each logic module having at least two logic module clusters, each of said logic module clusters comprising:
      a plurality of receiver components;
      a plurality of transmitter components;
      at least one buffer module;
      at least one sequential logic component; and
      a first combinatorial logic component having a dedicated carry-in input and carry-out output and a second combinatorial logic component having a carry-in input and carry-out output adjacent to said first combinatorial logic unit, wherein said carry-out output of said first combinatorial unit is hardwired to said carry-in input of said second combinatorial logic unit.

2. The apparatus of claim 1 wherein a carry-out output of one of said combinatorial logic components of a first logic module cluster of a first logic module is coupled to a carry-in input of one of said combinatorial logic components in a second logic module cluster located in a second logic module located directly below said first logic module in the same column.

3. The apparatus of claim 1 wherein said carry-in inputs of each of said second combinatorial logic components are hardwired to said carry-in inputs of said first combinatorial logic component to form a 2-bit carry lookahead adder.

4. The apparatus of claim 3 wherein said carry-out output of said second combinatorial logic component of the first logic module cluster of a first logic module is coupled to said carry-in input of said first combinatorial logic component in a second logic module cluster located in a second logic module located directly below said first logic module in the same column forming a 4-bit ripple carry adder.

5. A method of forming a carry chain in a field programmable gate array comprising:
   providing a plurality of logic modules each logic module having two clusters, said logic modules arranged in rows and columns, said logic module clusters comprising:
      a plurality of receiver components;
      a plurality of transmitter components;
      at least one buffer module;
      at least one sequential logic component; and
      a first combinatorial logic component having a dedicated carry-in input and carry-out output and a second combinatorial logic component having a carry-in input and carry-out output adjacent to said first combinatorial logic unit, wherein said carry-out output of said first combinatorial unit is hardwired to said carry-in input of said second combinatorial logic unit.

6. The method of claim 5 further comprising:
   coupling a carry-out output of said second combinatorial logic component of a first logic module cluster of a first logic module to a carry-in input of said first combinatorial logic component in a second logic module cluster located in a second logic module located directly below said first logic module in the same column.

7. The method of claim 5 further comprising:
   hardwiring a carry-in input of each of said second combinatorial logic component to a carry-in input of said first combinatorial logic component to form a 2-bit carry lookahead adder.

8. The method of claim 6 further comprising:
   coupling a carry-out output of said second combinatorial logic component of a first logic module cluster of a first logic module to a carry-in input of said first combinatorial logic component in a second logic module cluster located in a second logic module located directly below said first logic module in the same column to form a 4-bit ripple carry adder.

* * * * *